United States Patent
Wentworth

(10) Patent No.: US 9,496,697 B1
(45) Date of Patent: Nov. 15, 2016

(54) ROOF TOP JUNCTION BOX

(71) Applicant: Imagineering Plus Plus, LLC, San Antonio, TX (US)

(72) Inventor: Stuart Wentworth, San Antonio, TX (US)

(73) Assignee: Imagineering Plus Plus LLC, San Antonio, TX (US)

( * ) Notice: Subject to any disclaimer, the term of this patent is extended or adjusted under 35 U.S.C. 154(b) by 0 days.

(21) Appl. No.: 14/885,867

(22) Filed: Oct. 16, 2015

(51) Int. Cl.
  *H05K 5/06* (2006.01)
  *H02G 3/08* (2006.01)
  *H02G 1/00* (2006.01)
  *H05K 5/02* (2006.01)

(52) U.S. Cl.
  CPC ............ *H02G 3/088* (2013.01); *H02G 1/00* (2013.01); *H02G 3/083* (2013.01); *H02G 3/086* (2013.01); *H05K 5/0204* (2013.01); *H05K 5/0221* (2013.01); *H05K 5/0226* (2013.01); *H05K 5/0247* (2013.01); *H05K 5/069* (2013.01)

(58) Field of Classification Search
  CPC .. H05K 5/0204; H05K 5/069; H05K 5/0247; H05K 5/0221; H05K 5/0226
  See application file for complete search history.

(56) References Cited

U.S. PATENT DOCUMENTS

| | | | |
|---|---|---|---|
| 284,139 A | 8/1883 | Mcelroy | |
| 794,742 A | 7/1905 | Procunier | |
| 1,131,399 A | 3/1915 | McGinley | |
| 1,695,633 A | 6/1925 | Clark | |
| 1,833,306 A | 7/1927 | Barrel | |
| 1,782,546 A | 9/1927 | Newman | |
| 1,828,064 A | 3/1928 | Paine | |
| 1,774,934 A | 9/1928 | Mangin | |
| 1,928,198 A | 7/1932 | Buchanan | |
| 2,299,674 A | 1/1940 | Austin | |
| 2,360,359 A | 10/1944 | Meyers | |
| 2,440,372 A | 4/1948 | Jackson | |
| 2,674,470 A | 4/1954 | Appleton | |
| 2,861,120 A | 11/1958 | Park | |
| 3,215,303 A | 11/1965 | Dearle | |
| 4,151,363 A | 4/1979 | Nichols | |
| 4,420,022 A | 12/1983 | Landry | |
| 5,067,685 A | 11/1991 | Johnston, Jr. | |
| 5,646,371 A * | 7/1997 | Fabian | H02G 3/123 174/58 |
| 5,698,820 A * | 12/1997 | Collard | H02G 3/125 174/57 |
| 6,516,741 B1 * | 2/2003 | Sorum | G10K 9/04 116/137 R |
| 6,526,701 B2 * | 3/2003 | Stearns | E04D 13/10 248/237 |
| 6,734,356 B1 * | 5/2004 | Gretz | F04D 25/088 174/50 |
| 7,041,901 B2 | 5/2006 | Case | |
| 7,078,623 B1 | 7/2006 | Sheehan | |
| 7,128,345 B2 * | 10/2006 | Bartholoma | F16L 5/027 285/137.11 |
| 7,154,040 B1 | 12/2006 | Tompkins | |
| 7,762,027 B1 * | 7/2010 | Wentworth | F24J 2/5245 126/621 |

(Continued)

*Primary Examiner* — Hung V Ngo
(74) *Attorney, Agent, or Firm* — Temmerman Law Office; Mathew J. Temmerman

(57) ABSTRACT

A roof top junction box to protect wiring systems and a roof top from water leakages. The junction box includes a storage unit and an enclosure. A mounting component is fastened at an internal storage area of the storage unit to secure a terminal component thereon. Threaded screw elements are aligned in at least two of a plurality of screw hole channels utilizing a first sealing gaskets, a plurality of rubber washers and a plurality of press fit flutes. The plurality of threaded screw elements is affixed at a flashing member attached to the roof top. A compression ring and a multithreaded flute are aligned at a bottom conduit port in the storage unit. A conduit is inserted through the bottom conduit port and an opening at the flashing member to connect the conduit with at least one wiring system of a building.

36 Claims, 14 Drawing Sheets

(56) References Cited

U.S. PATENT DOCUMENTS

| | | | |
|---|---|---|---|
| 7,861,485 B1 * | 1/2011 | Wentworth | E04D 1/30 182/45 |
| 8,158,884 B2 * | 4/2012 | de la Borbolla | H02G 3/085 174/50 |
| 8,177,086 B2 | 5/2012 | Marquis-Martin | |
| 8,479,455 B2 * | 7/2013 | Schaefer | E04D 13/1476 174/564 |
| 8,701,360 B2 | 4/2014 | Ressler | |
| 2010/0307074 A1 * | 12/2010 | Stearns | E04D 13/10 52/173.1 |

* cited by examiner

ROOF TOP JUNCTION BOX

BACKGROUND OF THE DISCLOSURE

1. Technical Field of the Disclosure

The present embodiment relates generally to roof top junction boxes, and more particularly to a waterproof rooftop junction box device designed to directly connect with a flashing member attached to a roof top of a building.

2. Description of the Related Art

Roof top junction boxes are protective containers for securing wiring systems and cables from water leakages, fire, corrosion, dust, radio frequency interference, voltage overload and chemical hazards. The junction box stores switches, mounting brackets, sockets and wirings in a concealed manner. Further, these junction boxes transfer electric power from one source to other circuits and cables which are in need of power. The junction boxes are used in emergency light systems and in the prevention of short circuits. The junction boxes are adapted to be used with machinery such as machine tools which utilizes electric power and solar power. With the introduction of junction boxes, there has been a transition from an open wiring system to a conduit based wiring system.

The junction boxes are fixed at ceiling joists, wall studs, exterior surfaces, flat roofs, poles, or shingled roof tops, or any on a building's structure. Usually, the junction boxes are made from poly vinyl chloride, steel, metal or thermoplastics. They include large wiring space, suitable cable ports and numerous openings for securing both incoming and outgoing cables. When the junction box is installed on a roof top, the electrical wiring is connected from the junction box to an attic through the roof top. However, conventional junction boxes have considerable drawbacks.

For example, one method describes an outlet box having a detachable supporting bracket and a detachable lath holder. The supporting bracket and the lath holder are made integral with the outlet box, but their removability renders a wider scope of use and permits their attachment to and use in connection with various other types of boxes or receptacles. Even so, this device suffers from significant risk of water permeation through the periphery of the outlet box after installation and is therefore not entirely satisfactory.

Another embodiment describes a junction box assembly having a case member for containing the joined ends of electrical conductors. The case member can be moved arcuately with respect to a base member. The junction box further includes a base member having a mounting plate and a case retainer attached thereto to form a guideway which serves to guide and hold the lip of the case member. But, this junction box is not aesthetically pleasing.

Yet another method describes a modular electrical connector box mounting system particularly adapted for securable, re-positionable, suspension upon a roof-like structure. It is used in conjunction with other suspended equipment, such as air conditioning equipment, which is suspended upon an I-beam and a related truss structure. However, this electrical connector box has bulk structure and hence is very expensive.

Therefore, there is a need for a roof top junction box that is economical and reliable. Such a needed device would have simple construction and be aesthetically pleasing. Such a needed device would prevent water leakages inside the junction box. Further, such a needed device would be capable of directly attaching onto a roof top. The present embodiment accomplishes these objectives.

SUMMARY OF THE DISCLOSURE

To minimize the limitations found in the prior art, and to minimize other limitations that will be apparent upon the reading of the specification, the preferred embodiment of the present invention provides a roof top junction box for protecting wiring systems from water leakages and a roof top. The roof top junction box comprises a storage unit and an enclosure. The storage unit includes an internal storage area and a bottom conduit port. The internal storage area includes a base surface having a plurality of screw holes designed to connect with a mounting component. The bottom conduit port is designed to pass a conduit therethrough. The junction box further comprises a plurality of screw hole channels. Each of the plurality of screw hole channels is positioned at each of a plurality of peripheral corners of the storage unit. The storage unit includes a plurality of side walls to secure at least one terminal component secured in the internal storage area. The at least one terminal component is adaptable to connect with at least one wiring system of a building. The enclosure provides water proof protection to the at least one terminal component secured in the internal storage area.

The enclosure is detachably attached to the storage unit utilizing a locking mechanism. The locking mechanism is designed to easily disengage the enclosure from the storage unit. The locking mechanism includes a pair of storage unit hinges and a storage lock attached to the storage unit and a pair of enclosure hinges and an enclosure lock attached to the enclosure. The pair of storage unit hinges and the pair of enclosure hinges enable the junction box to be opened and closed easily. The storage lock and the enclosure lock enable the enclosure to tightly locked with the storage unit thereby preventing the entry of water content inside the storage unit and the roof top portion under the junction box.

A plurality of interior walls separates each of the plurality of screw hole channels from the internal storage area thereby protecting the plurality of screw hole channels from any possible water leakages at the internal storage area and at the roof top portion under the junction box. A bottom portion includes a plurality of base ledges each positioned below each of the plurality of screw hole channels. The plurality of base ledges provides proper balance to the junction box during the installation on a roof top of a building.

The junction box further includes a plurality of press fit flutes aligned inside the plurality of screw hole channels. At least two of the plurality of screw hole channels are aligned with each of the plurality of press fit flutes. The junction box is affixed on the roof top utilizing a plurality of threaded screw elements and a flashing member. Each of the plurality of threaded screw elements extends downwards through each of the plurality of press fit flutes in the at least two of the plurality of screw hole channels. The plurality of threaded screw elements and the plurality of press fit flutes are designed to align with the flashing member. Because of the exemplary design, the junction box can be directly attached to the roof top thereby improving the stability of the junction box.

The at least two of the plurality of screw hole channels includes a plurality of first sealing gaskets and a plurality of rubber washers. Each of the plurality of first sealing gaskets is attached to a top portion of each of the plurality of press fit flutes to securely hold each of the plurality of threaded screw elements corresponding to the at least two of the plurality of screw hole channels. Each of the plurality of rubber washers is positioned at an interior portion of each of the plurality of base ledges corresponding to the at least two of the plurality of screw hole channels. The plurality of first sealing gaskets prevents the entry of water into the at least two of the plurality of screw hole channels. A multithreaded flute is aligned with the bottom conduit port and swedged into the flashing member. The multithreaded flute is designed to tightly pass the conduit through the bottom conduit port and an opening at the flashing member utilizing a conduit fastening assembly thereby enabling the conduit to connect with the at least one wiring system of the building. The at least one wiring system may be an electrical wiring system, a solar wiring system, a television wiring system from a satellite dish, a cable wiring system carrying internet etc. The multithreaded flute includes an upper thread portion and a lower thread portion. The conduit fastening assembly includes a second sealing gasket, a compression ring and a nut. The lower thread portion utilizes the second sealing gasket to secure the conduit with the flashing member. The upper thread portion utilizes the compression ring and the nut to tightly pass the conduit through the bottom conduit port and the opening at the flashing member to the roof top of the building.

A first objective of the present invention is to provide a roof top junction box for protecting wiring systems and roof top from water leakages.

A second objective of the present invention is to provide a roof top junction box having simple construction and aesthetically pleasing design.

A third objective of the present invention is to provide a roof top junction box having a first sealing gasket to prevent water leakages inside the junction box and the roof top.

A fourth objective of the present invention is to provide a roof top junction box capable of directly attaching onto a roof top of a building structure.

A fifth objective of the present invention is to provide a roof top junction box that allows a conduit to connect with at least one wiring system of a building.

A further objective of the present invention is to provide a roof top junction box having a rigid locking mechanism.

A still another objective of the present invention is to provide a roof top junction box having a plurality of interior walls that protects from any possible water leakages at an internal storage area of the junction box.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
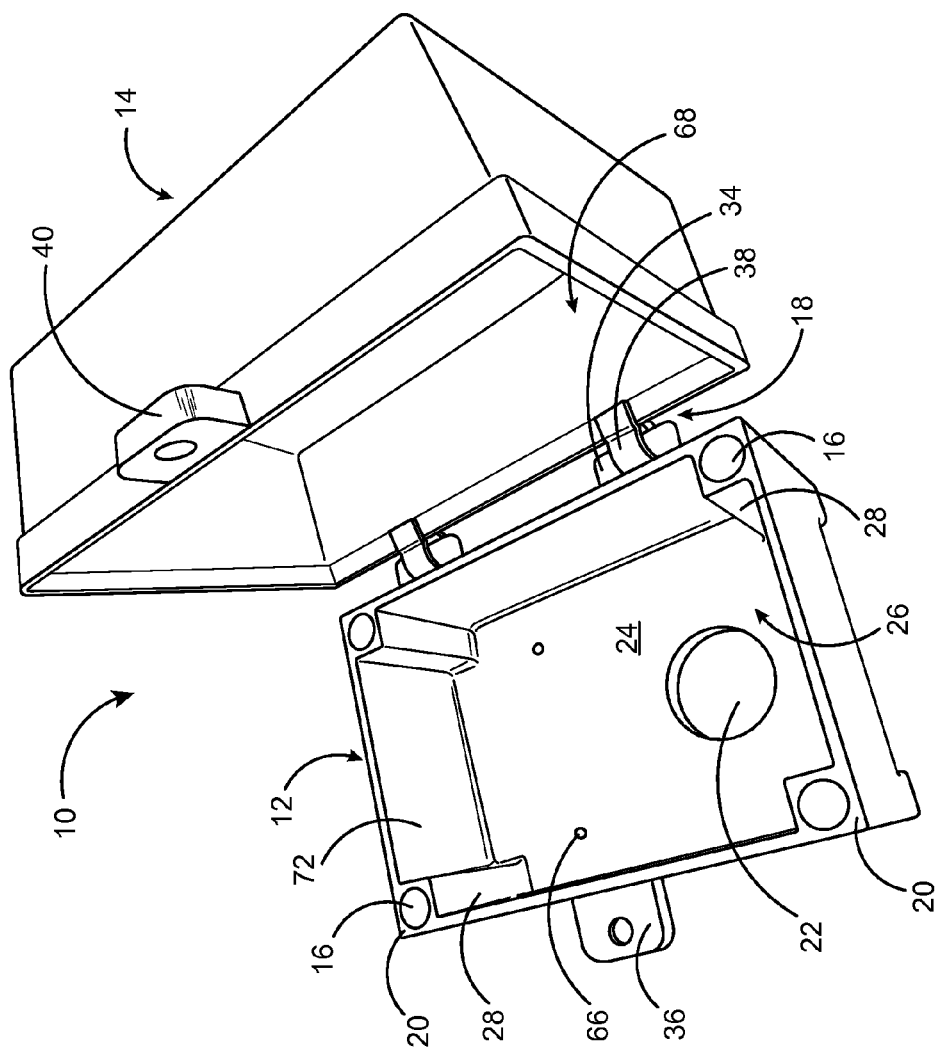
FIG. 1 is a perspective view of a roof top junction box according to the preferred embodiment of the present invention.
Figure 2:
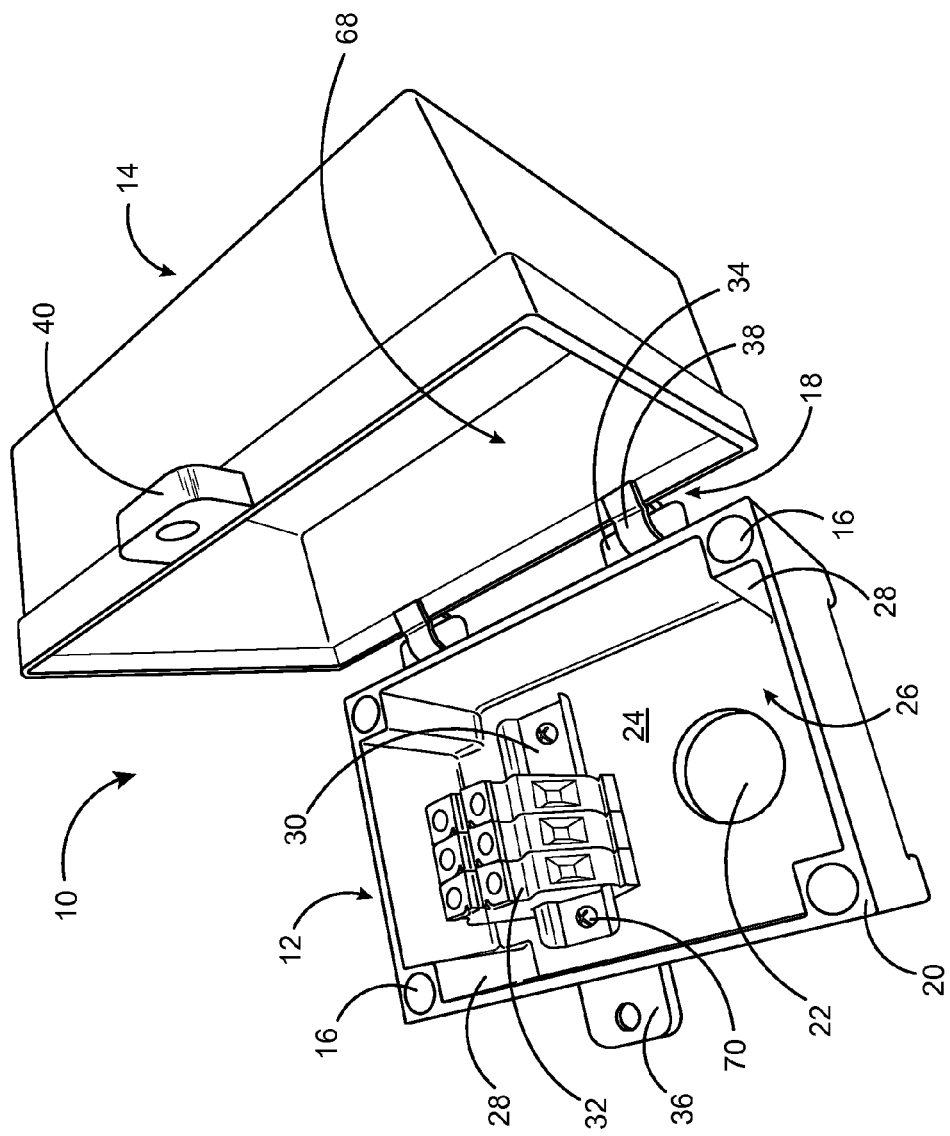
FIG. 2 is a perspective view of the present invention, illustrating at least one terminal component secured at an internal storage area of the roof top junction box.

Referring to FIGS. 1-12B of the drawings, a roof top junction box for protecting different wiring systems from water leakages according to the present invention is illustrated in different views and generally designated by the reference numeral 10. The roof top junction box 10 comprises a storage unit 12 and an enclosure 14. The storage unit 12 includes an internal storage area 26 and a bottom conduit port 22. The internal storage area 26 includes a base surface 24 having a plurality of screw holes 66 designed to connect with a mounting component 30 (FIG. 2). The bottom conduit port 22 is designed to pass a conduit 58 (FIG. 5) therethrough. The junction box 10 further comprises a plurality of screw hole channels 16. Each of the plurality of screw hole channels 16 is positioned at each of a plurality of peripheral corners 20 of the storage unit 12. In the preferred configuration, there are four screw hole channels 16 each positioned at four peripheral corners 20 of the storage unit 12. The storage unit 12 includes a plurality of side walls 72 to secure at least one terminal component 32 (FIG. 2) secured in the internal storage area 26. The at least one terminal component 32 is adaptable to connect with the at least one wiring system of a building.

As shown in FIG. 2, the enclosure 14 is detachably attached to the storage unit 12 utilizing a locking mechanism 18. The enclosure 14 provides water proof protection to the at least one terminal component 32 secured in the internal storage area 26 and the roof top portion under the junction box 10. The enclosure 14 includes an enclosure area 68 large enough to occupy several terminal components 32 in the internal storage area 26. The storage unit 12 and the enclosure 14 have half of the exact height of the junction box 10 which enables an installer's hands to reach inside the box and make the connections.

The locking mechanism 18 is designed to easily disengage the enclosure 14 from the storage unit 12. The locking mechanism 18 includes a pair of storage unit hinges 34 and a storage lock 36 attached to the storage unit 12 and a pair of enclosure hinges 38 and an enclosure lock 40 attached to the enclosure 14. The pair of storage unit hinges 34 and the pair of enclosure hinges 38 enable the junction box 10 to be opened and closed easily. The storage lock 36 and the enclosure lock 40 enable the enclosure 14 to get tightly locked with the storage unit 12 thereby preventing the entry of water content inside the storage unit 12 and at the roof top 64. The pair of enclosure hinges 38 is shaped such that the enclosure hinges 38 drops over the pair of storage unit hinges 34 when the junction box 10 is in a 180 degree open position. Then, as the pair of enclosure hinges 38 pivots around the pair of storage unit hinges 34, the pair of enclosure hinges 38 is captivated and locked into place.

Figure 8:
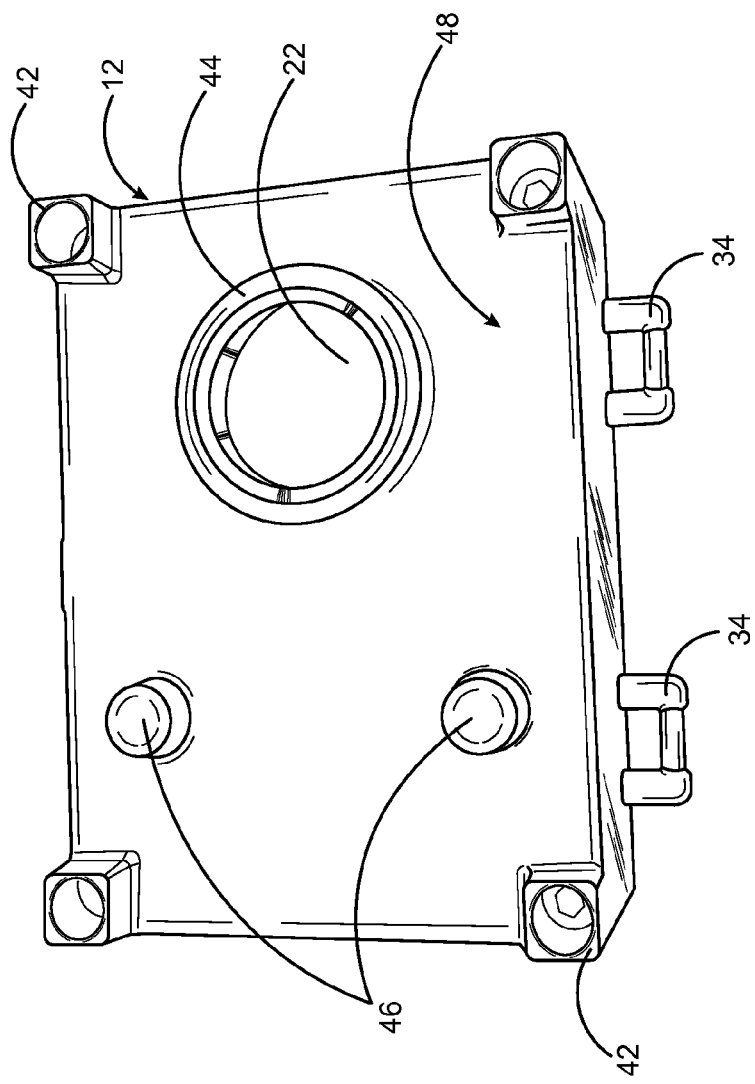
FIG. 8 is a perspective view of a bottom portion of the present invention, illustrating a second sealing gasket affixed around the bottom conduit port.
Figure 9:
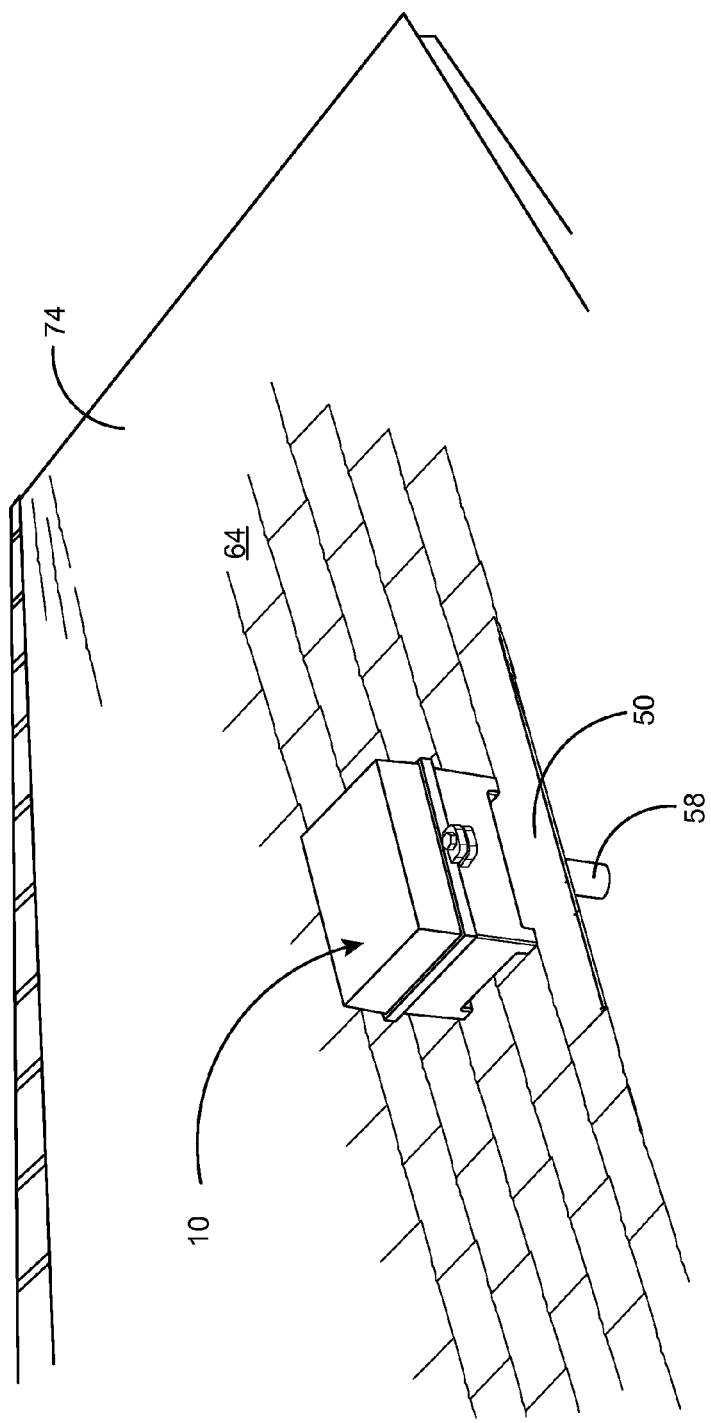
FIG. 9 is a perspective view of the present invention, illustrating the roof top junction box in use.

As shown in FIG. 2, the mounting component 30 is adaptable to securely fasten at least one terminal component 32 such as switch, socket and other wiring systems thereon. The at least one wiring system may be an electrical wiring system, a solar wiring system, a television wiring system from a satellite dish, a cable wiring system carrying internet etc. A plurality of interior walls 28 separates each of the plurality of screw hole channels 16 from the internal storage area 26 thereby protecting the plurality of screw hole channels 16 from any possible water leakages at the internal storage area 26 and at the roof top portion under the junction box 10. A bottom portion 48 (FIG. 8) includes a plurality of base ledges 42 (FIG. 8), each positioned below each of the plurality of screw hole channels 16. The plurality of base ledges 42 provides proper balance to the junction box 10 during the installation on a roof top 64 (FIG. 9) of a building 74 (FIG. 9).

Figure 3:
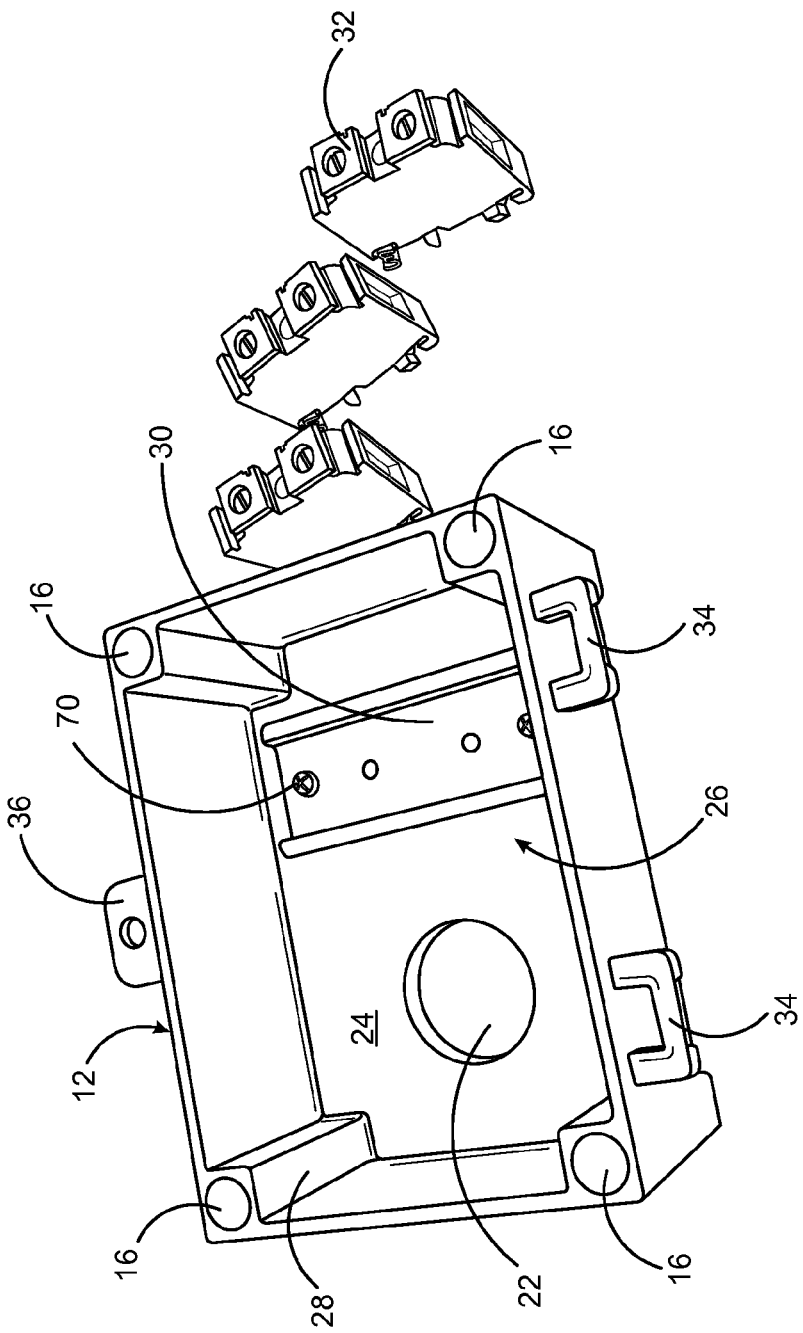
FIG. 3 is a perspective view of a storage unit according to the preferred embodiment of the present invention.

In one aspect of the preferred configuration, as shown in FIG. 3, the mounting component 30 is a din rail which is a standard off the shelf component at the electrical yard that is kind of a universal channel to snap in a variety of conductor units, such as a direct wire to wire unit or a fused wire to wire unit. The din rail is fastened to the base surface utilizing a plurality of rail fastening means 70. The plurality of screw holes 66 tightly secure at least one terminal component 32 inside the storage unit 12. Corresponding to the plurality of screw holes 66, there is a plurality of bottom supports 46 (FIG. 8) positioned at the bottom portion 48 (FIG. 8).

Figure 4:
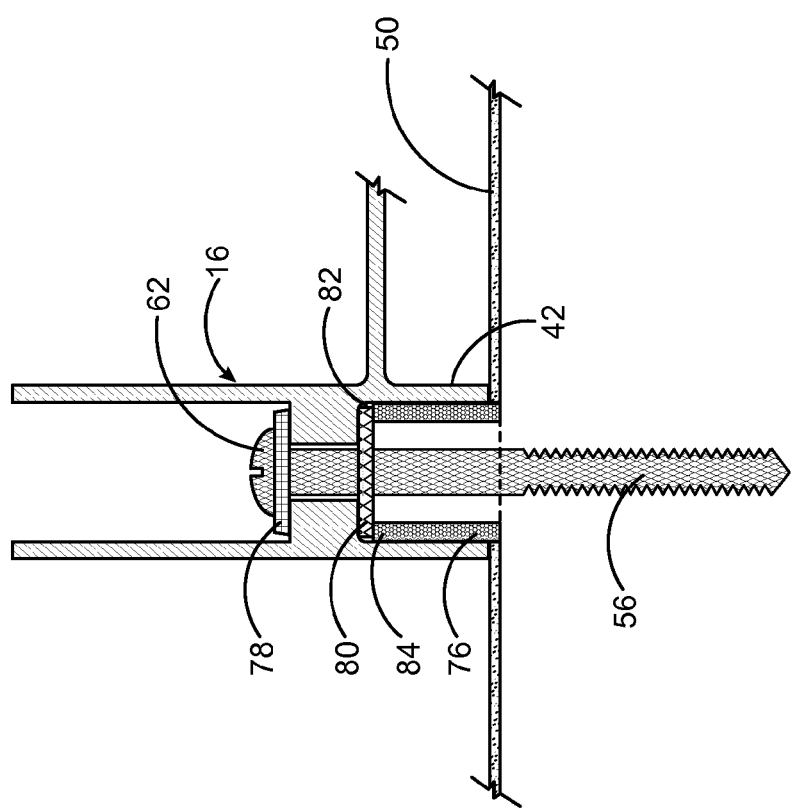
FIG. 4 is a cross-sectional view of a threaded screw element aligned inside a screw hole channel according to the preferred embodiment of the present invention.
Figure 5:
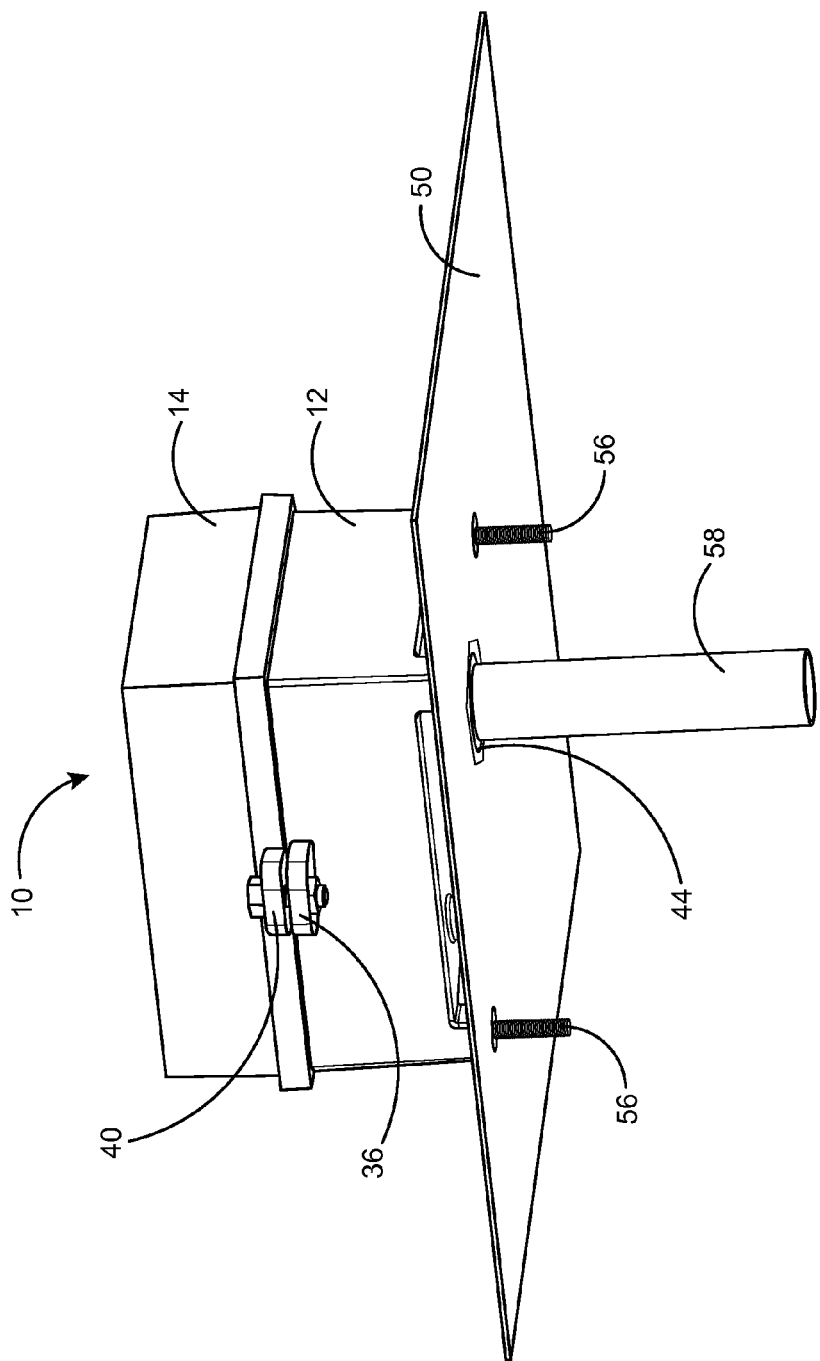
FIG. 5 is a perspective view of the present invention, illustrating the junction box attached to a flashing member.

Referring to FIG. 4, the junction box 10 further includes a plurality of press fit flutes 76 aligned inside the plurality of screw hole channels 16. In one embodiment of the present invention, at least two of the plurality of screw hole channels 16 are aligned with each of the plurality of press fit flutes 76. Referring to FIG. 5, the junction box 10 is affixed on the rooftop 64 utilizing a plurality of threaded screw elements 56 and a flashing member 50. As shown in FIG. 4, each of the plurality of threaded screw elements 56 extends downwards through each of the plurality of press fit flutes 76 in the at least two of the plurality of screw hole channels 16. The plurality of threaded screw elements 56 and the plurality of press fit flutes 76 are designed to align with the flashing member 50. The junction box 10 can be directly attached to the roof top 64 thereby improving the stability of the junction box 10.

As shown in FIG. 4, the at least two of the plurality of screw hole channels 16 includes a plurality of first sealing gaskets 78 and a plurality of rubber washers 80. Each of the plurality of first sealing gaskets 78 is attached to a top portion 84 of each of the plurality of press fit flutes 76 to securely hold each of the plurality of threaded screw elements 56 corresponding to the at least two of the plurality of screw hole channels 16. Each of the plurality of rubber washers 80 is positioned at an interior portion 82 of each of the plurality of base ledges 42 corresponding to the at least two of the plurality of screw hole channels 16. A threaded top portion 62 of each of the plurality of threaded screw elements 56 firmly holds the threaded screw elements between the first sealing gasket 78 and the rubber washer 80.

Figure 6:
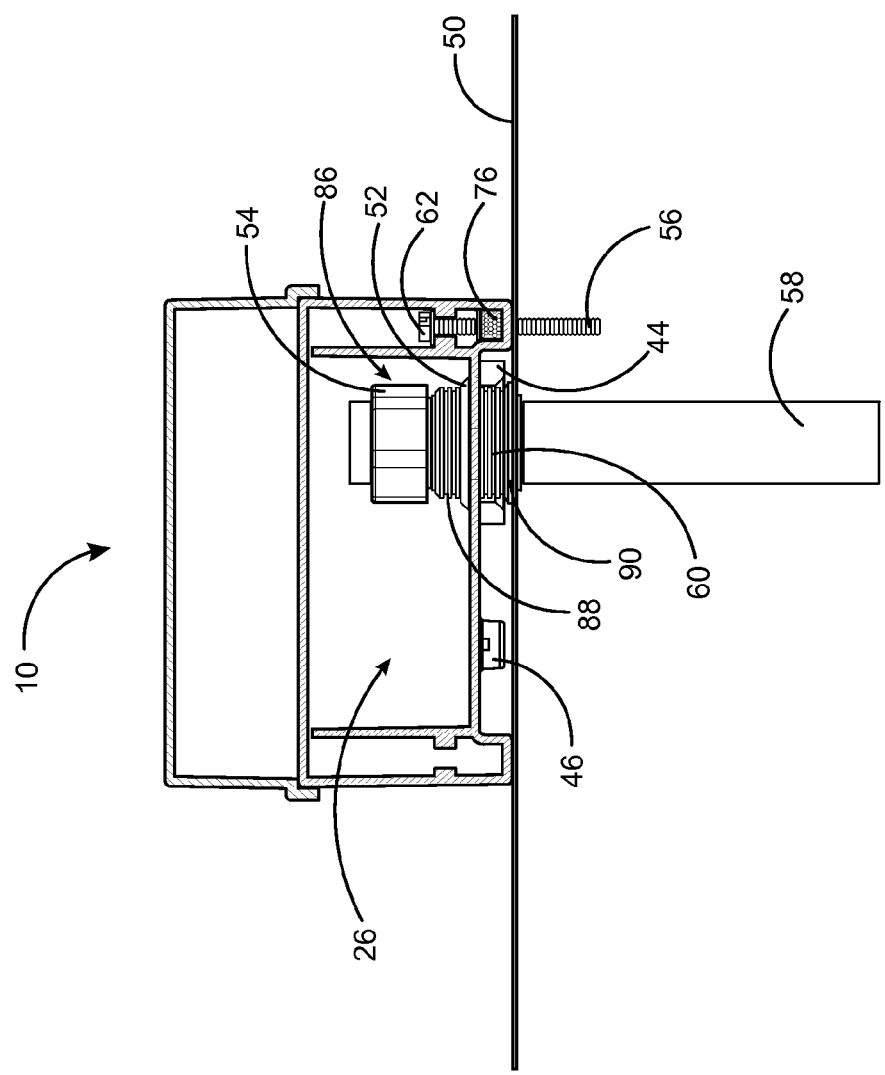
FIG. 6 is a cross-sectional view of a conduit fastening assembly of a multithreaded flute according to the preferred embodiment of the present invention.

The plurality of first sealing gaskets 78 directs the flow of water towards the roof top 64 of the building 74 thereby preventing the entry of water into the at least two of the plurality of screw hole channels 16 and to the roof top 64. As shown in FIG. 6, a multithreaded flute 60 is aligned with the bottom conduit port 22 and swedged into the flashing member 50. The multithreaded flute 60 is designed to tightly pass the conduit 58 through the bottom conduit port 22 and an opening (not shown) at the flashing member 50 utilizing a conduit fastening assembly 86 thereby enabling the conduit 58 to connect with the at least one wiring system of the building 74 (FIG. 9). The multithreaded flute 60 includes an upper thread portion 88 and a lower thread portion 90. The conduit fastening assembly 86 includes a second sealing gasket 44, a compression ring 52 and a nut 54. The lower thread portion 90 utilizes the second sealing gasket 44 to secure the conduit 58 with the flashing member 50. The upper thread portion 88 utilizes the compression ring 52 and the nut 54 to tightly pass the conduit 58 through the bottom conduit port 22 and the opening (not shown) at the flashing member 50 to the roof top 64 (FIG. 9) of the building 74.

Aforementioned versatile design of the conduit fastening assembly 86 facilitates the installation of the junction box 10 on the roof top 64. With this design, the installer is not required to go to the roof top 64 and run the conduit 58 to the junction box 10, rather he could drop the conduit 58 from the top into the roof 64, where he desires to fix. Thereafter, he can complete the run to the source. This eliminates half of the run around between the roof top 64 and the attic. In the preferred embodiment, the conduit 58 is an electrical metal tubing (EMT).

Figure 7:
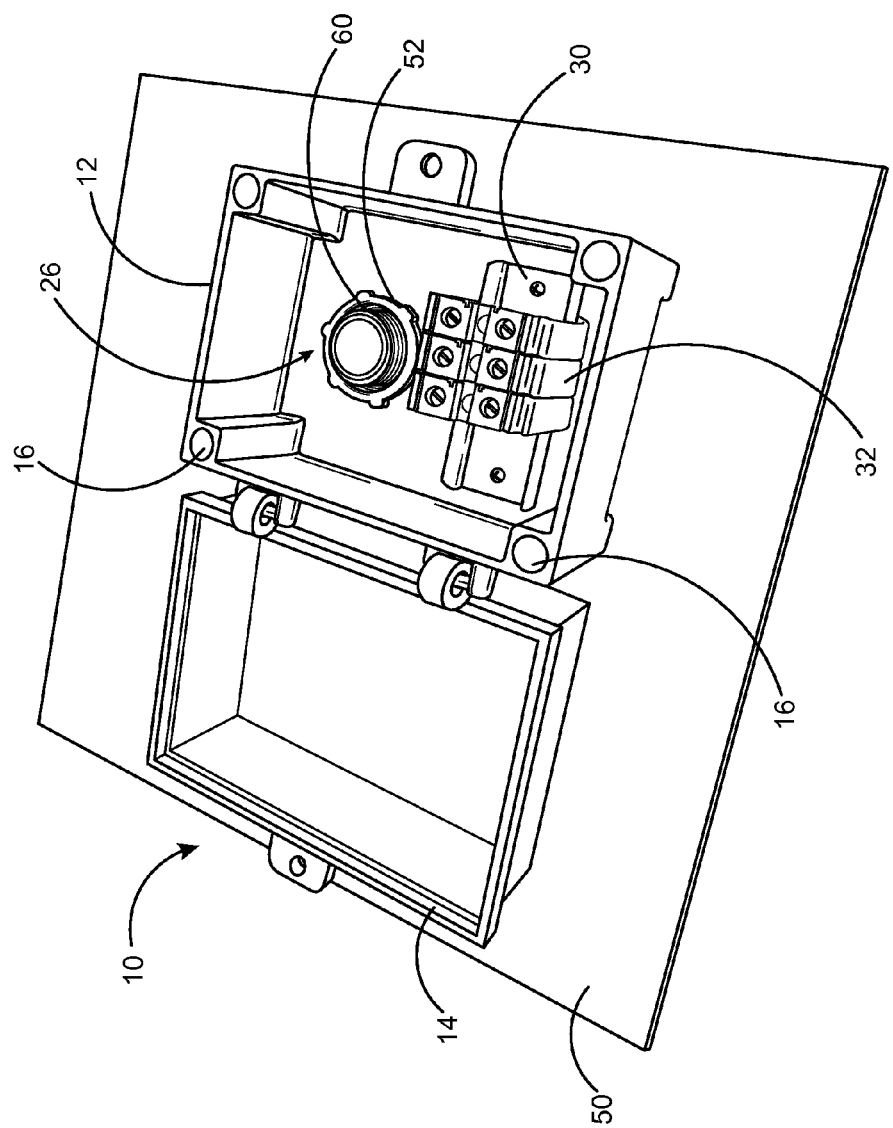
FIG. 7 is a perspective view of present invention, illustrating a compression ring and the multithreaded flute inside the storage unit of the junction box.

FIG. 9 shows the junction box in use. The mounting component 30 is fastened at the internal storage area 26. The at least one terminal component 32 is secured at the mounting component 30. Then, the plurality of threaded screw elements 56 is aligned in at least two of the plurality of screw hole channels 16 utilizing the plurality of first sealing gaskets 78, the plurality of rubber washers 80 and the plurality of press fit flutes 76. Next, the plurality of threaded screw elements 56 is affixed at the flashing member 50 attached to the roof top 64. As shown in FIG. 7, the compression ring 52 and the multithreaded flute 60 are aligned at the bottom conduit port 22. The conduit 58 is inserted through the bottom conduit port 22 and the opening (not shown) at the flashing member 50. Thereafter, the conduit 58 is tightened with the flashing member 50 utilizing the nut 54 and the second sealing gasket 44. This preferred simple and reliable method facilitates the connection between the conduit 58 and the wiring system of the building 74 as depicted in FIG. 9.

Figure 10:
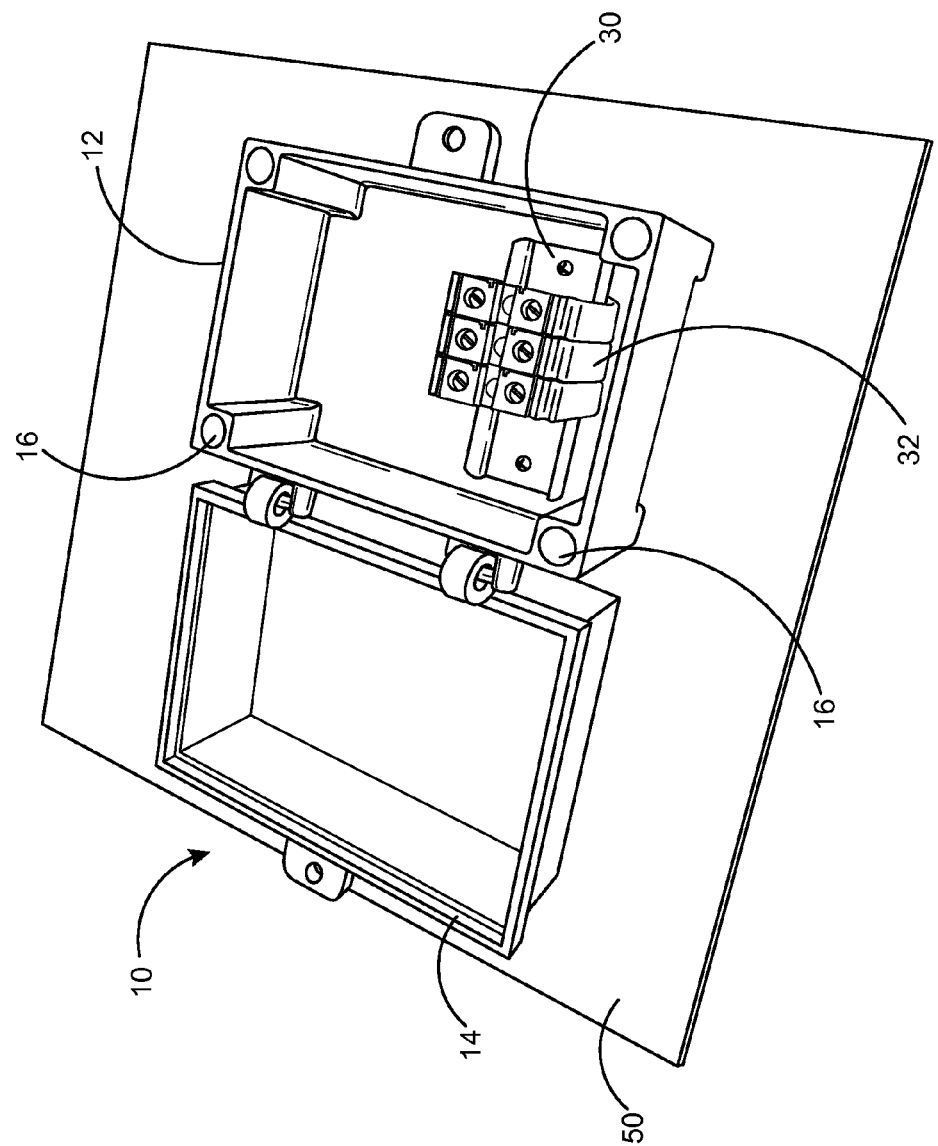
FIG. 10 is a perspective view of another embodiment of the present invention, illustrating a roof top junction box without a bottom conduit port.

In another aspect of the preferred embodiment, the roof top junction box 10 does not include the conduit 58 for connecting the junction box 10 and the at least one wiring system of the building as shown in FIG. 10. This is the case where the roof top 64 is integrated with roof top panel modules having spatial arrangement. In this arrangement, each panel module is separated spatially and their connection traverses from one group to another before dropping through the roof top 64. Since there is no conduit 64 being used, this junction box 10 does not include the multithreaded flute 60 and the conduit fastening assembly 86. Here, the wires and cables of the at least one wiring system pass through the sides of the junction box 10 without passing through the conduit 58.

Figure 11A:
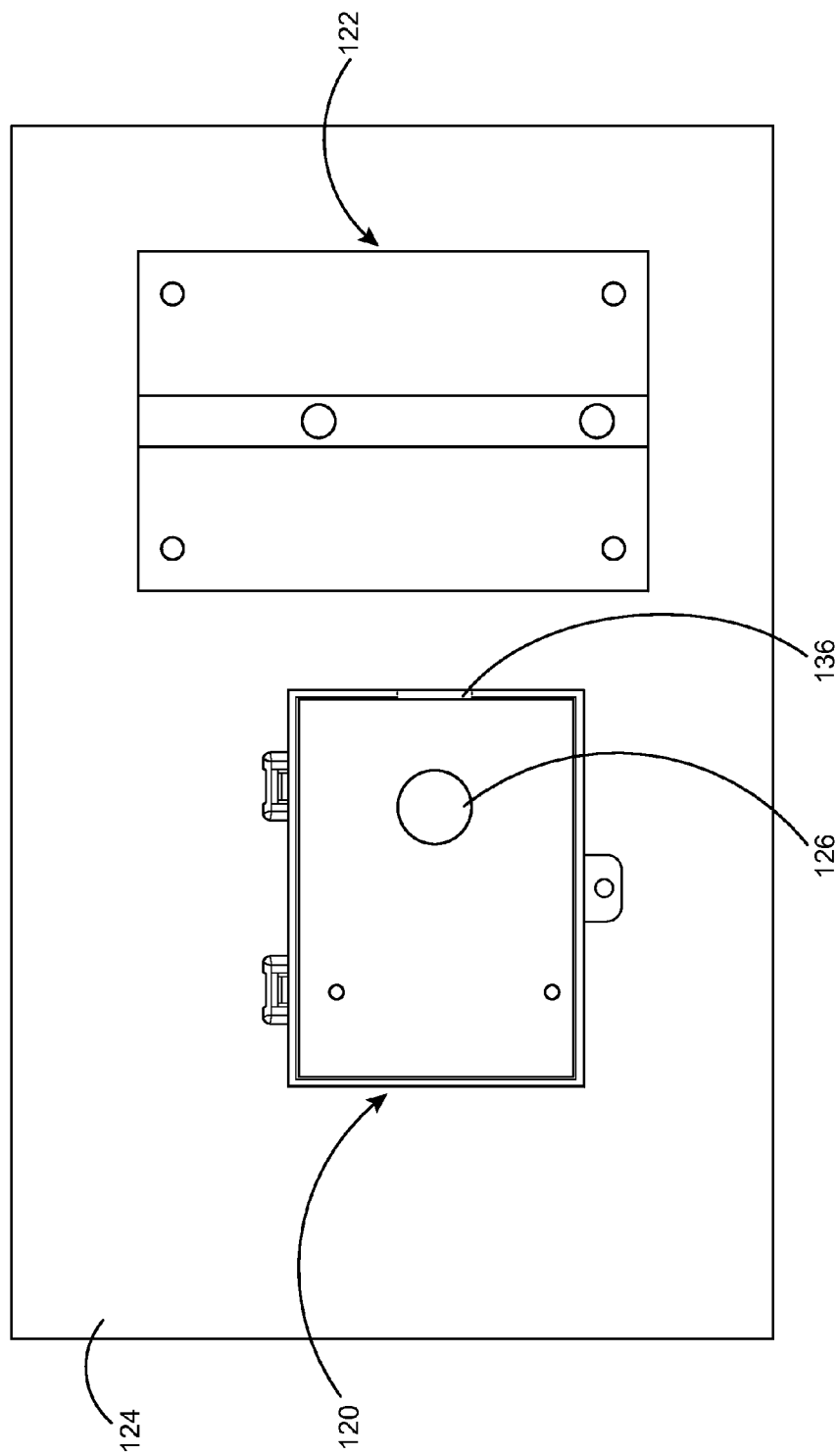
FIG. 11A is a top view of yet another embodiment of the present invention, illustrating a satellite dish mount attached to the flashing.
Figure 11B:
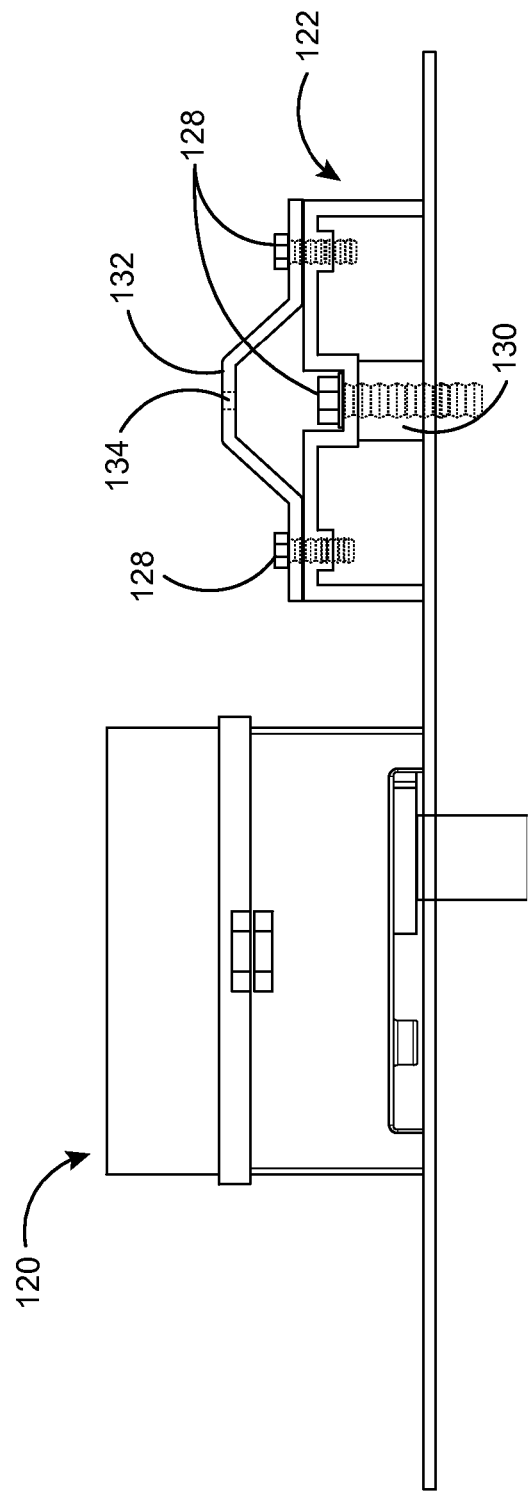
FIG. 11B is a side view of the embodiment shown in FIG. 11A.

FIG. 11A illustrates another configuration of the roof top junction box 120 illustrating a satellite dish mount 122 attached to a flashing member 124. In this configuration, the flashing member 124 is large enough to attach the roof top junction box 120 and the satellite dish mount 122 thereon. The roof top junction box 120 includes a bottom conduit port 126. A side conduit port 136 which is in close proximity to the satellite dish mount 122 allows the wire associated with a satellite dish (not shown) to pass through the roof top 64 in close proximity and eliminates the need for two flashing members 124. FIG. 11B illustrates the satellite dish mount 122 configuration in more detail. As shown in FIG. 11B, three nuts 128 attached to the dish mount 122. Another set of three nuts (not shown) are attached to a rear side (not shown) of the dish mount 122 thereby bringing the total number of nuts to six. The satellite dish mount configuration further includes two flutes 130 which pass through the roof top 64. Each of the two flutes 130 includes a bar of aluminum 132 mounted on a top portion thereof. The bar of aluminum 132 includes four holes 134 for attaching a satellite dish (not shown) thereon. With the help of the two flutes 130, this configuration acts as a converter from a four hole attachment system of the satellite dish (not shown) to a two hole system thereby reducing the number of holes that must be punched through the roof top 64. The two holes punched for the two flutes 130 going through the roof top 64 will each go into a rafter. In contrast, in the case of a standard satellite installation, only two of the four flutes would hit the rafter and the other two flutes 130 would not connect with the rafter.

In certain cases where the larger flashing member 124 does not fit on the roof, then two separate flashing members are used, one for the satellite dish mount 122 and the other for the junction box 120.

Figure 12A:
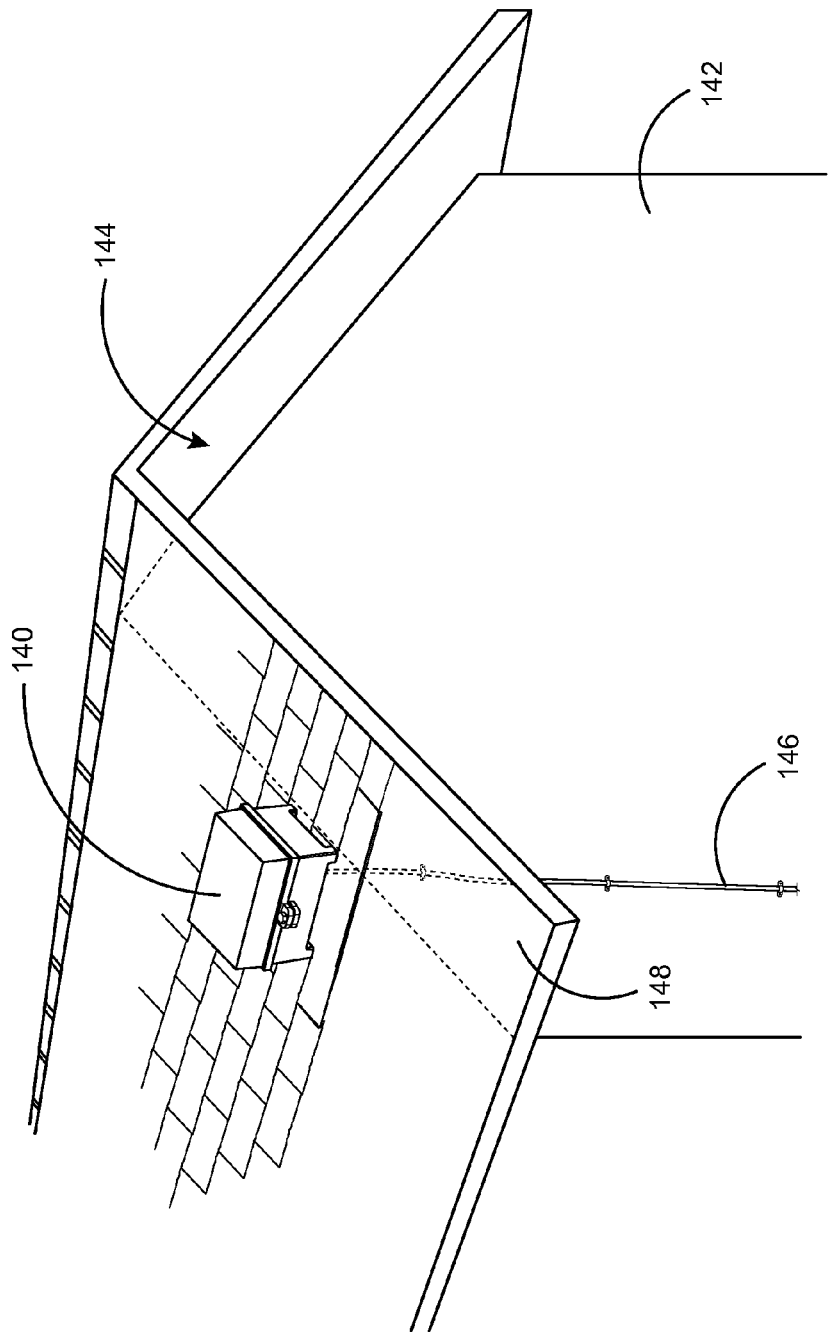
FIG. 12A is a perspective view of yet another embodiment of the present invention, illustrating a roof top junction box hanged on an external wall of a building.
Figure 12B:
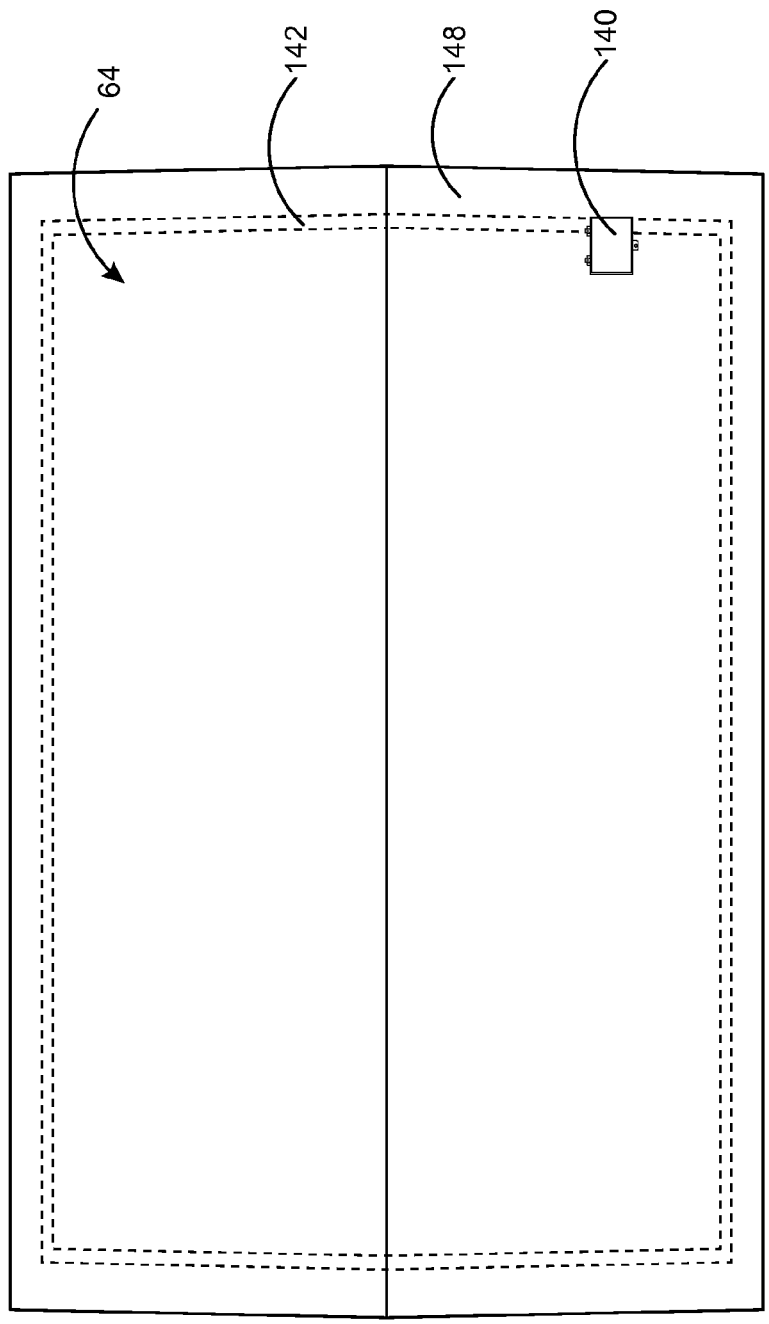
FIG. 12B is a top plan view of the embodiment shown in FIG. 12A.

Yet another configuration of a roof top junction box 140 is illustrated in FIGS. 12A and 12B. The roof top junction box 140 adaptable to hang on an exterior wall 142 of a building 144 is illustrated. In this configuration, the roof top junction box 140 is designed to line up with the exterior wall 142 of the building 144. This type of configuration is beneficial for people who do not want to penetrate through the roof top 64 over a living space and who do not want to install the junction box 10 in the attic thereby getting rid of the very ugly overhang wrap around the conduit 58. Further, the eve drop configuration enables a wiring system 146 to go through an overhang portion 148 and just drops down the exterior wall 142 of the building 144.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. A roof top junction box comprising:
a storage unit comprising:
an internal storage area having a base surface with a plurality of screw holes and a bottom conduit port to pass a conduit therethrough, the plurality of screw holes being connected with a mounting component adaptable to securely fasten at to least one terminal component thereon, the at least one terminal component being adaptable to connect with at least one wiring system of a building;
a plurality of peripheral corners;
a plurality of screw hole channels, each positioned at each of a plurality of peripheral corners of the storage unit;
a plurality of interior walls to separate each of the plurality of screw hole channels from the internal storage area;
a bottom portion having a plurality of base ledges;
a plurality of press fit flutes, each aligned inside at least two of the plurality of screw hole channels;
a plurality of threaded screw elements to affix the junction box with a roof top of a building, each of the plurality of threaded screw elements extends downwards through each of the plurality of press fit flutes, the plurality of threaded screw elements and the plurality of press fit flutes designed to align with a flashing member that being attached to the roof top;
a plurality of first sealing gaskets, each attached to a top portion of each of the plurality of press fit flutes to securely hold each of the plurality of threaded screw elements corresponding to the at least two of the plurality of screw hole channels;
a plurality of rubber washers, each positioned at an interior portion of each of the plurality of base ledges corresponding to the at least two of the plurality of screw hole channels; and
a multithreaded flute aligned with the bottom conduit port and swedged into the flashing member, the multithreaded flute being designed to tightly pass the conduit through the bottom conduit port and an opening at the flashing member utilizing a conduit fastening assembly thereby enabling the conduit to connect with the at least one wiring system of the building; and
an enclosure detachably attached to the storage unit utilizing a locking mechanism, the enclosure provides water proof protection to the at least one terminal component secured in the internal storage area and the roof top portion under the roof top junction box;
whereby the flashing member enables the junction box to directly attach to the roof top thereby improving the stability of the junction box.

2. The roof top junction box of claim 1 further comprises a plurality of side walls to secure the at least one terminal component in the internal storage area.

3. The roof top junction box of claim 1 wherein each of the plurality of base ledges is positioned below each of the plurality of screw hole channels.

4. The roof top junction box of claim 1 wherein the plurality of interior walls protects the plurality of screw hole channels from any possible water leakages at the internal storage area.

5. The roof top junction box of claim 1 wherein the conduit fastening assembly includes a second sealing gasket, a compression ring and a nut.

6. The roof top junction box of claim 1 wherein the multithreaded flute includes an upper thread portion and a lower thread portion.

7. The roof top junction box of claim 6 wherein the lower thread portion utilizes the second sealing gasket to secure the conduit with the flashing member.

8. The roof top junction box of claim 6 wherein the upper thread portion utilizes the compression ring and the nut to tightly pass the conduit through the bottom conduit port and the opening at the flashing member to the roof top of the building.

9. The roof top junction box of claim 1 wherein the locking mechanism is designed to easily disengage the enclosure from the storage unit.

10. The roof top junction box of claim 1 wherein the locking mechanism includes a pair of storage unit hinges and a storage lock attached to the storage unit and a pair of enclosure hinges and an enclosure lock attached to the enclosure.

11. The roof top junction box of claim 10 wherein the pair of storage unit hinges and to the pair of enclosure hinges enable the junction box to be opened and closed easily.

12. The roof top junction box of claim 10 wherein the storage lock and the enclosure lock enable the enclosure to tightly engage with the storage unit in a closed condition thereby preventing the entry of water content inside the storage unit.

13. The roof top junction box of claim 1 wherein the plurality of first sealing gaskets directs water to flow towards the roof top of the building thereby preventing the entry of water into the at least two of the plurality of screw hole channels.

14. The roof top junction box of claim 1 is configured to pass the at least one wiring system through an overhang portion and drops down at an exterior wall of the building.

15. A roof top junction box for protecting wiring systems from water leakages, the roof top junction box comprising:
 a storage unit comprising:
  an internal storage area having a base surface with a plurality of screw holes and a bottom conduit port to pass a conduit therethrough, the plurality of screw holes being connected with a mounting component adaptable to securely fasten at least one terminal component thereon, the at least one terminal component being adaptable to connect with at least one wiring system of a building;
  a plurality of peripheral corners;
  a plurality of side walls to secure the at least one terminal component in the internal storage area;
  a plurality of screw hole channels, each positioned at each of the plurality of peripheral corners of the storage unit;
  a plurality of interior walls to separate each of the plurality of screw hole channels from the internal storage area;
  a bottom portion having a plurality of base ledges, each of the plurality of base ledges being positioned below each of the plurality of screw hole channels;
  a plurality of press fit flutes, each aligned inside at least two of the plurality of screw hole channels;
  to a plurality of threaded screw elements, each extends downwards through each of the plurality of press fit flutes, the plurality of threaded screw elements and the plurality of press fit flutes being designed to align with a flashing member that enables the junction box to affix with a roof top of a building, the flashing member being attached to the roof top;
  a plurality of first sealing gaskets, each attached to a top portion of each of the plurality of press fit flutes to securely hold each of the plurality of threaded screw elements in the at least two of the plurality of screw hole channels;
  a plurality of rubber washers, each positioned at an interior portion of each of the plurality of base ledges corresponding to the at least two of the plurality of screw hole channels, each of the plurality of rubber washers firmly prevents entry of water inside the at least two of the plurality of screw hole channels; and
  a multithreaded flute aligned with the bottom conduit port and swedged into the flashing member, the multithreaded flute being designed to tightly pass the conduit through the bottom conduit port and an opening at the flashing member utilizing a conduit fastening assembly thereby enabling the conduit to connect with the at least one wiring system of the building; and
 an enclosure detachably attached to the storage unit utilizing a locking mechanism, the enclosure provides water proof protection to the at least one terminal component secured in the internal storage area of the storage unit and the roof top portion under the junction box;
 whereby the bottom conduit port, the opening at the flashing member and the conduit fastening assembly enable the conduit to connect with the at least one wiring system.

16. The roof top junction box of claim 15 wherein the plurality of interior walls protects the plurality of screw hole channels from any possible water leakages at the internal storage area.

17. The roof top junction box of claim 15 wherein the conduit fastening assembly includes a second sealing gasket, a compression ring and a nut.

18. The roof top junction box of claim 15 wherein the multithreaded flute includes an upper thread portion and a lower thread portion.

19. The roof top junction box of claim 18 wherein the lower thread portion utilizes the second sealing gasket to secure the conduit with the flashing member.

20. The roof top junction box of claim 18 wherein the upper thread portion utilizes the compression ring and the nut to tightly pass the conduit through the bottom conduit port and the opening at the flashing member to the roof top of the building.

21. The roof top junction box of claim 15 wherein the locking mechanism includes a pair of storage unit hinges and a storage lock attached to the storage unit and a pair of enclosure hinges and an enclosure lock attached to the enclosure.

22. The roof top junction box of claim 21 wherein the storage lock and the enclosure lock enable the enclosure to tightly engage with the storage unit in a closed condition thereby preventing the entry of water content inside the storage unit.

23. The roof top junction box of claim 15 wherein the plurality of first sealing gaskets prevents the entry of water into the at least two of the plurality of screw hole channels.

24. The roof top junction box of claim 15 is configured to pass the at least one wiring system through an overhang portion and drops down at an exterior wall of the building.

25. A roof top junction box for protecting wiring systems from water leakages, the roof top junction box comprising:
a storage unit comprising:
an internal storage area having a base surface with a plurality of screw holes and a bottom conduit port to pass a conduit therethrough, the plurality of screw holes being connected with a mounting component adaptable to securely fasten at least one terminal component thereon, the at least one terminal component being adaptable to connect with at least one wiring system of a building;
a plurality of peripheral corners;
to a plurality of side walls to secure the at least one terminal component in the internal storage area;
a plurality of screw hole channels, each positioned at each of the plurality of peripheral corners of the storage unit;
a plurality of interior walls to separate each of the plurality of screw hole channels from the internal storage area thereby protecting the plurality of screw hole channels from any possible water leakages inside the storage unit;
a bottom portion having a plurality of base ledges, each of the plurality of base ledges being positioned below each of the plurality of screw hole channels;
a plurality of press fit flutes, each aligned inside at least two of the plurality of screw hole channels;
a plurality of threaded screw elements, each extends downwards through each of the plurality of press fit flutes, the plurality of threaded screw elements and the plurality of press fit flutes being designed to align with a flashing member that enables the junction box to affix with a roof top;
a plurality of first sealing gaskets, each attached to a top portion of each of the plurality of press fit flutes to securely hold each of the plurality of threaded screw elements in the at least two of the plurality of screw hole channels;
a plurality of rubber washers, each positioned at an interior portion of each of the plurality of base ledges corresponding to the at least two of the plurality of screw hole channels, each of the plurality of rubber washers firmly prevents entry of water inside the at least two of the plurality of screw hole channels; and
a multithreaded flute aligned with the bottom conduit port and swedged into the flashing member, the multithreaded flute being designed to tightly pass the conduit through the bottom conduit port and an opening at the flashing member attached to the rooftop utilizing a conduit fastening assembly thereby enabling the conduit to connect with the at least one wiring system of the building, the conduit fastening assembly includes a second sealing gasket, a compression ring and a nut, the multithreaded flute includes an upper thread portion and a lower thread portion; and
an enclosure detachably attached to the storage unit utilizing a locking mechanism, the enclosure provides a water proof protection to the at least one terminal component secured at the internal storage area and the roof top portion under the junction box;
whereby the conduit fastening assembly, the upper thread portion and the lower thread portion tightly pass the conduit through the bottom conduit port and the opening at the flashing member to the roof top thereby enabling the conduit to connect with the at least one wiring system of the building.

26. The roof top junction box of claim 25 wherein the flashing member enables the junction box to directly attach to the roof top thereby improving the stability of the junction box.

27. The roof top junction box of claim 26 wherein the plurality of first sealing gaskets prevents the entry of water into the at least two of the plurality of screw hole channels.

28. The roof top junction box of claim 26 is configured to pass the at least one wiring system through an overhang portion and drops down at an exterior wall of the building.

29. The roof top junction box of claim 25 wherein the locking mechanism is designed to easily disengage the enclosure from the storage unit.

30. The roof top junction box of claim 25 wherein the locking mechanism includes a pair of storage unit hinges and a storage lock attached to the storage unit.

31. The roof top junction box of claim 25 wherein the locking mechanism includes a pair of enclosure hinges and an enclosure lock attached to the enclosure.

32. The roof top junction box of claim 31 wherein the enclosure lock enable the enclosure to tightly engage with the storage unit in a closed condition thereby preventing the entry of water content inside the storage unit.

33. A method for installing a roof top junction box on a roof top of a building, the method comprising the steps of:
a) providing the roof top junction box having a storage unit and an enclosure, the storage unit includes an internal storage area, a plurality of screw holes, a plurality of screw hole channels, a plurality of interior walls, a plurality of press fit flutes, a plurality of threaded screw elements, a multithreaded flute, a bottom conduit port and a conduit fastening assembly;
b) fastening a mounting component at the internal storage area of the storage unit;
c) securing at least one terminal component at the mounting component;
d) aligning a plurality of threaded screw elements with at least two of the plurality of screw hole channels utilizing a plurality of sealing gaskets, a plurality of rubber washers and the plurality of press fit flutes;
e) affixing the plurality of threaded screw elements at a flashing member attached to the roof top;
f) aligning a compression ring and a multithreaded flute at the bottom conduit port;
g) inserting a conduit through the bottom conduit port and an opening at the flashing member; and
h) tightening the conduit with the flashing member utilizing a nut and a second sealing gasket thereby enabling the conduit to connect with at least one wiring system of the building.

34. The method of claim 33 wherein the enclosure is detachably attached to the storage unit utilizing a locking mechanism.

35. The method of claim 33 wherein the plurality of first sealing gaskets prevents the entry of water into the at least two of the plurality of screw hole channels.

36. The method of claim 33 wherein the plurality of interior walls protects the plurality of screw hole channels from any possible water leakages inside the storage unit and the roof top portion under the junction box.

\* \* \* \* \*